United States Patent [19]
Leung et al.

[11] Patent Number: 5,777,912
[45] Date of Patent: Jul. 7, 1998

[54] LINEAR PHASE FINITE IMPULSE RESPONSE FILTER WITH PRE-ADDITION

[75] Inventors: Ka Yin Leung, Austin; Eric J. Swanson, Buda; Kafai Leung, Austin, all of Tex.

[73] Assignee: Crystal Semiconductor Corporation, Austin, Tex.

[21] Appl. No.: 623,134

[22] Filed: Mar. 28, 1996

[51] Int. Cl.[6] .................................................. G06F 17/10
[52] U.S. Cl. ............................................................ 364/724.16
[58] Field of Search .......................... 364/724.16, 724.1, 364/724.011; 375/232; 341/143, 120, 118

[56] References Cited

U.S. PATENT DOCUMENTS

| | | | |
|---|---|---|---|
| 4,564,918 | 1/1986 | McNally et al. | 364/569 |
| 4,716,472 | 12/1987 | McNally | 360/8 |
| 4,748,578 | 5/1988 | Lagadec et al. | 364/724 |
| 4,772,871 | 9/1988 | Suzuki et al. | 341/155 |
| 4,780,892 | 10/1988 | Lagadec | 375/118 |
| 4,825,398 | 4/1989 | Koch et al. | 364/724.1 |
| 4,943,807 | 7/1990 | Early . | |
| 5,081,604 | 1/1992 | Tanaka | 364/724.16 |
| 5,087,914 | 2/1992 | Sooch et al. | 341/120 |
| 5,157,395 | 10/1992 | Del Signore et al. | 341/143 |
| 5,212,659 | 5/1993 | Scott et al. | 364/724.1 |
| 5,248,970 | 9/1993 | Sooch et al. | 341/120 |
| 5,257,026 | 10/1993 | Thompson et al. | 341/118 |
| 5,381,357 | 1/1995 | Wedgwood et al. | 364/724.16 |
| 5,500,811 | 3/1996 | Corry | 364/724.16 |
| 5,500,874 | 3/1996 | Terrell | 375/232 |
| 5,541,864 | 7/1996 | Van Bavel et al. | 364/724.1 |
| 5,548,543 | 8/1996 | Wang | 364/724.16 |
| 5,590,065 | 12/1996 | Lin | 364/724.16 |

OTHER PUBLICATIONS

Robert Adams and Tom Kwan, "Theory and VLSI Architectures for Asynchronous Sample–Rate Converters," *J.Audio Eng. Soc.*, vol. 41, No. 7/8, Jul./Aug.

Robert Adams and Tom Kwan, "A Stereo Asynchronous Digital Sample–Rate Converter for Digital Audio," *IEEE Journal of Solid–State Circuits*, vol. 29, No. 4, Apr. 1994.

"Advance Information: DSP56ADC16 16–Bit Sigma–Delta Analog–to–Digital Converter,"Motorola, Inc., 1989.

M.S. Ghausi and K. R. Laker, "Modern Filter Design," by Bell Telephone Laboratories, Inc., pp. 342–357, 1981.

R.W. Adams, P.F. Ferguson, Jr., A Fanesan, S. Vincelette, A. Volpe, and R. Libert, "Theory and Practical Implementation of a Fifth–Order Sigma–Delta A/D Converter," *J.Audio Eng. Soc.*, vol. 39, nos. 7–8, pp. 515–527, Jul./Aug. 1991.

(List continued on next page.)

*Primary Examiner*—Reba I. Elmore
*Assistant Examiner*—Robert J. Dolan
*Attorney, Agent, or Firm*—Gregory M. Howispon; J. P. Violette

[57] ABSTRACT

A linear phase FIR filter includes a multiplication/accumulator engine which is operable to receive the multi-level data stream and multiply it by predetermined filter coefficients. The coefficients are symmetrical to allow a pre-addition operation wherein the data is first stored in a buffer and then the data for symmetrical coefficients added before multiplication by the coefficient. This results in a reduction of multiplications by a factor of two, thus allowing the multiplication/accumulator engine to operate at one-half the clock rate of the oversampled multi-level data bit stream. The pre-addition operation results in values of greater than "1" and less than "−1" which are then converted in the multiplication/accumulator engine to restrict the values that are input to the multiplication/accumulator engine to values of "+1", "0" and "−1", to allow the multiplication/accumulator engine to only perform a "pass through" of the coefficient value, an "inversion" of the coefficient value or replace the coefficient value with a "null" value. This is facilitated by processing the tri-level data through two paths, one for the "−1" and one for the "−1" term and providing a common mode offset in each of the paths. Additionally, the "−1" term has a correction factor associated therewith that can be added in the "−1" path prior to summing the two terms to provide a digital output at the sampling frequency.

32 Claims, 5 Drawing Sheets

OTHER PUBLICATIONS

S. A. Jantzi, W. M. Snelgrove, and P.F. Ferguson, Jr., "A Fourth–Order Bandpass Sigma–Delta Modulator," *IEEE Journal of Solid–State Circuits*, vol. 28, No. 3, pp. 282–291, Mar. 1993.

R. Gregorian and G.C. Temes, "Analog MOS Integrated Circuits for Signal Processing," *A Wiley–Interscience Publication*, John Wiley and Sons, pp. 265–401, 1986.

Lawrence R. Rabiner, Bernard Gold, "Theory and Application of Digital Signal Processing", pp. 328–329.

Charles D. Thompson, Salvador R. Bernadas, "A Digitally–Corrected 20b Delta–Sigma Modulator", 1994 IEEE International Solid–State Circuits Conference, pp. 194–195.

Y. Matsuya, K. Uchimura, A.Iwata, T.Kobayashi, "A 16–bit Oversampling A–to–D Conversion Technology Using Triple–Integration Noise Shaping",IEEE Journal of Solid–State Circuits, vol. SC–22, Dec. 1987, pp. 921–928.

Mehdi Hatamiam and Keshab K. Parhi, "An 85–MHz Fourth–Order Programmable IIH Digital Filter Chip", IEEE Journal of Solid–State Circuits, vol. 27, No. 2, Feb. 1992, pp. 175–183.

David Vallancourt and Yannis P. Tsividis "A Fully Programmable Sampled–Data Analog CMOS Filter with Transfer–Function Coefficients Determined by Timing", IEEE Journal of Solid–State Circuits, vol. SC–22, No. 6, Dec. 1987, pp. 1022–1030.

Kin Lin and John Poulos, "Area Efficient Decimation Filter for an 18–bit Delta–Sigma Anaog–to–Digital Convert", AES Feb. 1995, pp. 1–10.

Alan V. Oppenheim and Alan S. Willsky, "Signals and Systems", Analysis and Characterization of LTI Systems Using z–Transforms, Sec. 10.7, 1983.

David Vallancourt and Yannis P. Tsividis, "Timing–Controlled Fully Programmable Analog Signal Processors Using Switched Continuous–Time Filters", IEEE Transactions on Circuits and Systems, vol. 35, No. 8, Aug. 1988, pp. 947–954.

1994 Crystal Semiconductor Audio Databook, pp. 3–143.

DSP56000/DSP56001 Digital Signal Processor User's Manual, Rev. 2, pp. 11–8 –11–9, 1990.

Texas Instruments TMS320C3x User's Guide, 1992, pp. 8–12 –8–16.

Andreas Antoniou, "Digital Filters", Second Edition, 1993, pp. 366–381.

LINEAR PHASE FINITE IMPULSE RESPONSE FILTER WITH PRE-ADDITION

TECHNICAL FIELD OF THE INVENTION

The present invention pertains in general to analog-to-digital converters and, more particularly, to a multi-bit analog-to-digital converter utilizing pre-addition to reduce the clock rate thereof.

BACKGROUND OF THE INVENTION

Multi-bit Delta-Sigma analog-to-digital converters exhibit a number of advantages compared with the single-bit approach, including lower quantization noise and better idle channel tone performance. The non-perfection of the feedback DAC has been a source of error in such converters, and these errors have been addressed with self-calibration systems, such as that disclosed in U.S. Pat. No. 4,943,807, issued to Erly, on Jun. 24, 1990, and U.S. Pat. No. 5,257,026, issued to C. D. Thompson et al., on Oct. 26, 1993, both of which are incorporated herein by reference.

U.S. Pat. No. 5,257,026 discloses a system that accounts for non-linearities in the feedback DAC. This system utilizes two separate processors or digital filters which are operable to accommodate a multi-bit output string from a Delta-Sigma modulator of the type {−1,0,+1} wherein the terms {+1,0} are fed to one processor and the terms {0,−1} are fed to the other processor. Each of the processors is effectively a Finite Impulse Response (FIR) filter. The output of one of the filters is then multiplied by a factor "δ". The output of the other filter and the output of the δ-multiplier are then input to a subtraction circuit to derive the filter output.

The above reference must operate at a clock rate equal to the product of the input oversampled rate and the filter's tap number. For single-bit two-level data streams, a technique has been developed for linear phase filters to reduce the clock rate with pre-addition, wherein a linear filter with symmetrical coefficients has duplicate coefficients in the coefficient set. By adding the inputs with the same coefficients, only one multiplication needs to be performed, this providing a 50% reduction in the number of multiplications and, therefore, in the clock rate of the processing section. However, when utilizing the pre-addition technique, an input set {1,0} will result in the output of the pre-addition being {2,1,0}. Since there is now a value of "2" provided for in the multiplication operation, this requires a more complex multiplier than one that can be accommodated by the set having numbers in the set {+1,0,−1}. Although it is desirable to utilize the pre-addition technique with a level processor, or even a single-bit modulator output, this will typically require a more complex multiplier when utilizing pre-addition. Therefore, there exists a need to combine the pre-addition technology and the non-linearity correction aspect of the Thompson patent, without incurring the overhead of the more complex multiplier.

SUMMARY OF THE INVENTION

The present invention disclosed and claimed herein comprises a linear phase finite impulse response (FIR) filter, having a symmetrical filter coefficient set for receiving an oversampled digital data bit stream from an analog modulator and then convolving and decimating the data with the filter's coefficients to a higher resolution and lower sampling rate. The filter includes a pre-addition circuit for summing the input data values associated with each of the symmetrical coefficients, such that a summed data value can be output for each set of symmetrical coefficients. An encoding device is provided for encoding the summed data into a format restricted to the values of "+1", "0", or "−1". These multiplication controlled formatted values are then utilized to operate a multiplication engine. The multiplication engine operates in conjunction with the encoded control format values to pass the associated symmetrical coefficient through to an output when a "+1" value is encoded, output a null value when a "0" is encoded, and output the inverse of the associated symmetrical coefficient when a value of "−1" is encoded. The output of the multiplication engine is then input to an accumulator for accumulating the outputs from the multiplication engine over a sampling cycle for a given set of input data values in a sampling cycle.

In another aspect of the present invention, the data bit stream is comprised of a multi-level single-bit data stream. This multi-level single-bit data stream has non-linearities associated therewith. A non-linearity correction device is further provided for correcting non-linearities in the multi-level input data bit stream.

In another aspect of the present invention, the pre-addition circuit comprises a buffer for buffering the oversampled digital data bit stream for one sampling cycle. Thereafter, a summing circuit is provided for selecting pairs of the buffered data associated with a given one of the symmetrical coefficients that is input to the multiplication engine, and then providing on the output of the summation circuit the summing data associated with the symmetrical coefficient input to the multiplication engine.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
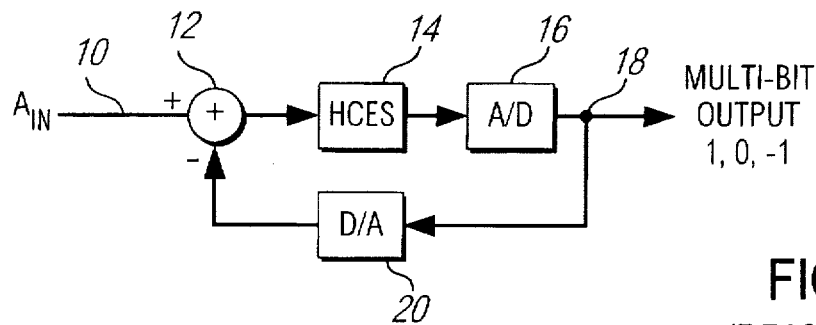
FIG. 1 illustrates a prior art analog-to-digital converter with a multi-bit output.

Referring now to FIG. 1, there is illustrated a block diagram of a prior art oversampled analog modulator for use with an analog-to-digital converter. The input to the analog modulator comprises an analog input line 10 which is input to the positive input of a summation junction 12. The output of the summation junction 12 is input to a block 14 for processing through a function H(z), where H(z) usually has a low pass function, the output thereof then processed through a tri-level analog-to-digital converter section 16 to provide on the output thereof an oversampled tri-level digital output of the set {1,0,-1} on a line 18. This is then input to a digital-to-analog converter 20, the output thereof input to the negative input of the summing junction 12. This provides a Delta-Sigma function, which is conventional. The output of the analog modulator is then input to the input of a digital filter (not shown), which is operable to convolve and decimate the data to a higher resolution and lower sampling rate.

Figure 2:
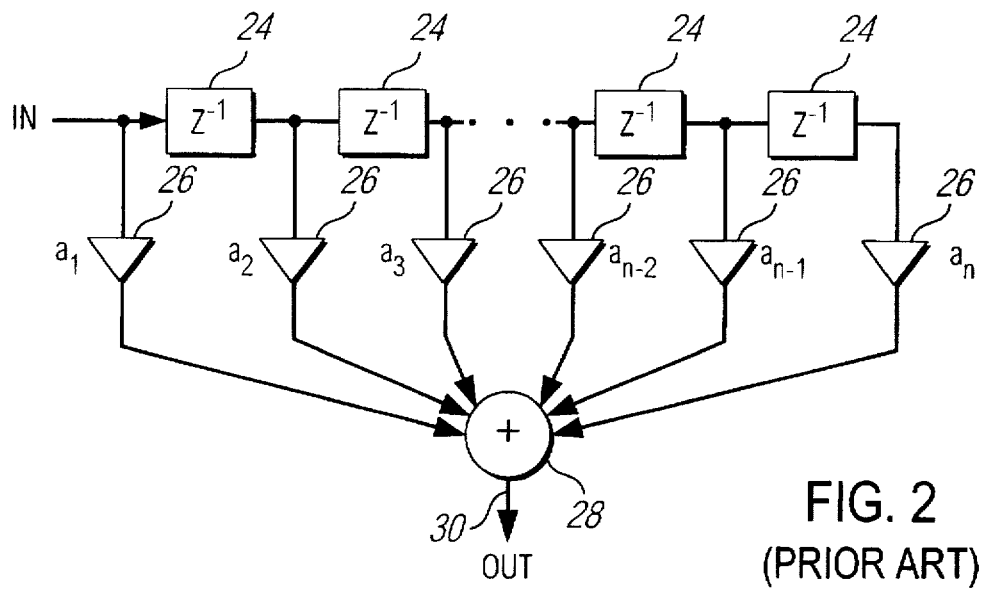
FIG. 2 illustrates a standard prior art FIR filter configuration.

Referring now to FIG. 2, there is illustrated a block diagram of a prior art filter section for filtering the multi-level digital output of the modulator of FIG. 1. The filter is comprised of a plurality of delay elements 24, with taps from the nodes between the delay lines input to multiplication blocks 26, each associated with a tap weight or coefficient $a_1$, through $a_n$. Once the input value is multiplied by the associated coefficient, it is then input to an accumulator 28 for summation thereof and then output on an output 30. The combination of both the modulator of FIG. 1 and the filter of FIG. 2 provides a conventional oversampled data converter where the output of the modulator operates at a multiple of sampling rate of, for example, 128 $f_s$ with the digital output of the filter, for example, 4096 taps, operating at a rate of $f_s$. Therefore, both the modulator of FIG. 1 and the delay element of FIG. 2 must operate at the higher oversampled rate of 128 $f_s$.

Figure 3:
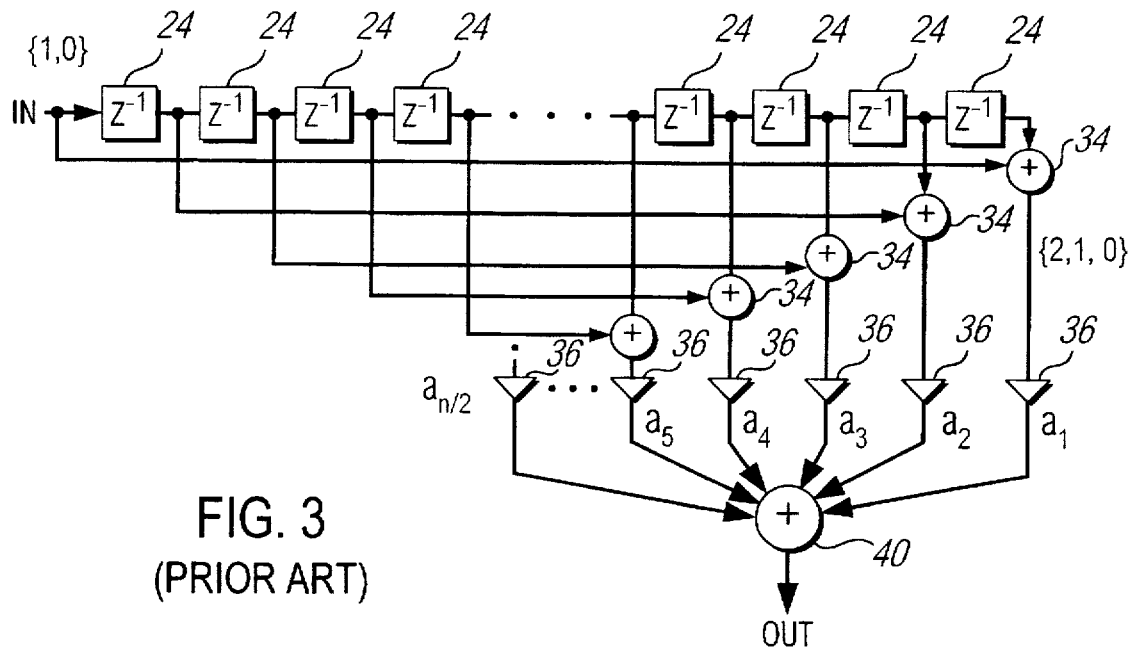
FIG. 3 illustrates a prior art pre-addition configuration for a linear phase FIR filter to reduce the number of multiplications.

Referring now to FIG. 3, there is illustrated a block diagram of a prior art linear phase filter with symmetrical coefficients utilizing pre-addition. In a linear phase filter, the coefficients that are utilized to realize the filter function in a FIR filter are symmetrical, i.e., the $a_1$, and $a_n$ coefficients are the same, the $a_2$ and $a_{n-1}$ coefficients are the same, etc. Once this aspect is recognized, it is then only necessary to sum the inputs associated with these coefficients and then only perform a single multiplication. Therefore, the inputs associated with the symmetrical coefficients are summed in summing blocks 34 and then input to multiplication blocks 36 for summation in a summation block 40. The coefficients associated with the multiplication blocks 36 are $a_1, a_2, \ldots, a_{n/2}$. This therefore provides one-half the number of multiplications, which in a multiplexed multiplication operation will require one-half the number of operations and will therefore require by one-half the clock rate, as compared to a conventional configuration. Of course, this pre-addition system only operates with a linear phase filter that has symmetrical coefficients. This pre-addition system is described in Y. Matsuya, K Uchimura, A. Iwata, T Kobayashi, M Ishikawa and T Yoshitome, "A Sixteen-Bit Over-Sampling A-to-D Conversion Technology Using Triple-Integration Noise Shaping", IEEE Journal of Solid-State Circuits, Vol. SC-22, No. 6, December 1987, Pages 921-928, which reference is incorporated herein by reference.

One disadvantage to the present pre-addition systems is that the pre-addition operation in and of itself will take an input set of values, for example {1,0} in a single bit input, and convert it at the output of the summation blocks 34 to a set {2,1,0}. For a multi-bit output of the set {1,0,-1}, the output of the summation block will be {2,1,0,-1,-2}. This will require the multiplier block 36 to accommodate the value of "2", therefore requiring a more complex multiplier. As will be described hereinbelow, Applicant's present invention utilizes a simple multiplier that requires either a value of "0" to be passed through, the coefficient value to be passed through or the inverse of the coefficient value to be passed therethrough.

Figure 4:
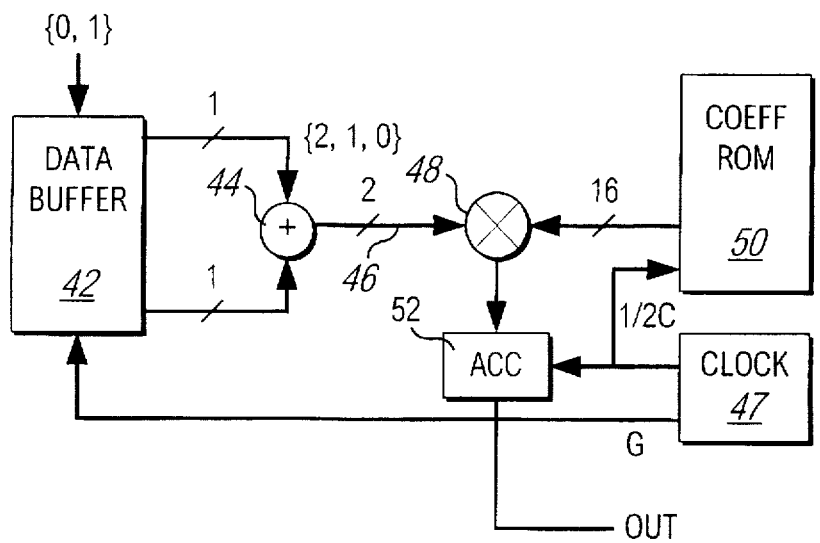
FIG. 4 illustrates a block diagram of the one bit analog-to-digital converter of the present invention utilizing pre-addition and a low complexity multiplier.

Referring now to FIG. 4, there is illustrated a block diagram of a single bit input filter utilizing pre-addition with the low complexity multiplier of the present invention. A data buffer 42 is provided for receiving the single bit data, the data buffer 42 being a plurality of registers or a Random Access Memory (RAM). The data buffer 42 has two outputs, which allow a given set of data in the data buffer 42 to be sampled, such that data associated with the symmetrical coefficients can be output, i.e., the data associated with the input of the first delay block 24 and the output of the last delay block 24, the data associated with the output of the next to last delay block 24 and the input to the second delay block 24, etc., are output as pairs of data and input to a summation junction 44. A clock signal received from a clock 47 is operable to clock this data operation at a predetermined rate sufficient to perform the operations disclosed herein, which will be described hereinbelow. It should be noted that the architecture of the data buffer 42 is conventional, in that data is input at the oversampled data rate of 128 $f_s$, and output at the sampling rate $F_s$, multiplied by the number of accesses to be made, there being two for each multiplication operation.

The output of the summation junction 44 provides the output values in the set {2,1,0} on a bus 46, this being a two-bit line. This is then input to a multiplication circuit 48, which receives the output of a coefficient ROM 50. The output thereof is input to an accumulator 52, the output of the accumulator 52 providing the digital output at the sampling rate of $f_s$. Both the accumulator 52 and the coefficient ROM 50 are clocked by the clock 47. Note that the multiplier 48 and accumulator 52 operate at one-half the clock rate of 4096 $f_s$, (the clock rate with no pre-addition), whereas the data buffer brings the data in at the full oversampled clock rate of 128 $f_s$. If the oversampled clock rate was 128 $f_s$, the multiplier 48 would operate at 2048 $f_s$, there being 4096 taps in the filter.

Figure 5:
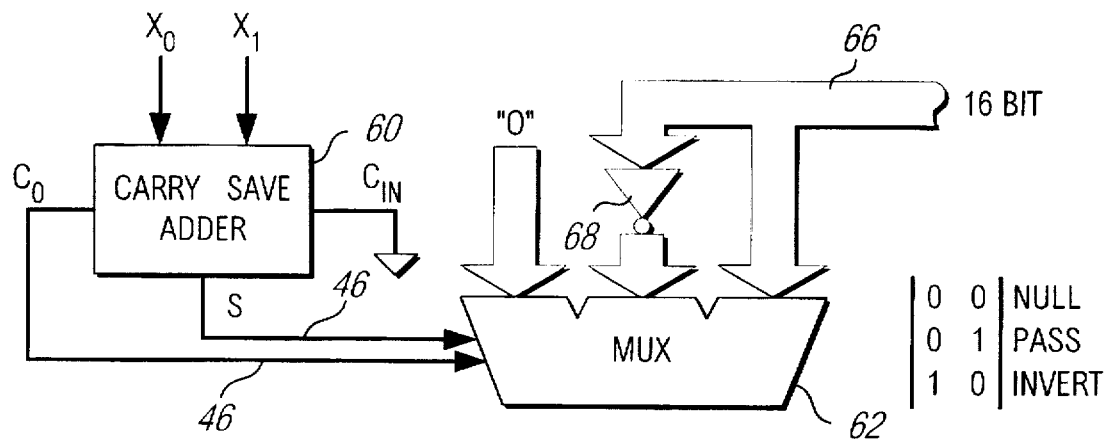
FIG. 5 illustrates a detailed block diagram a low complexity multiplier.

Referring now to FIG. 5, there is illustrated a detailed block diagram of the summing junction 44 and the multiplier 48. The summing junction 44 is realized with a Carry Save Adder 60 which receives the two input values $x_0$ and $x_1$, output from the data buffer 42 and provides on the output a Summation output S and a Carry output $C_o$. These provide the two-bit input on the bus 46. The Carry input $C_{in}$ is connected to ground. Therefore, whenever the values of $x_0$ and $x_1$ are both "0", this will indicate a NULL operation, a value of "01" will indicate a PASS operation and a value of "10" will indicate an invert operation. This operation is facilitated with the multiplier 48, which is realized with a three-input multiplexor 62. Three input multiplexor 62 is operable to receive on one input, the output of the coefficient rom 50 on a bus 66. On a second input, the contents of the bus 66 from the coefficient rom 50 are input to a multi-bit inverter 68, the output thereof input to the second input of the multiplexor 62 as the inverted value of the coefficient output by the coefficient rom 50. The bus 66 is a 16-bit bus in the present embodiment. The third input of the multiplexor 62 is connected to a "0" or NULL value. Therefore, the two-bit data word on the bus 46 is operable to select one of the three inputs, depending upon the logic state thereof. This therefore results in a simple "pass-through" operation where either the value retrieved from the coefficient ROM 50 is passed through or a value of "0" is passed through. Therefore, it can be seen that the set of {2,1,0} is converted by the Carry Save Adder 60 and the multiplexor 62 into a low complexity multiplier that does not require multiplication by a value of "2". The Carry Save Adder 60 configuration and the multiplexor 62 allows a pre-addition configuration to be facilitated with a "pass-through" multiplier, wherein no multiplications are actually performed in multiplication block 48.

Figure 6:
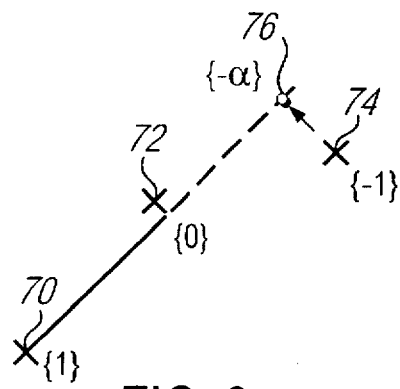
FIG. 6 illustrates a plot of the multi-bit input.

Referring now to FIG. 6, there is illustrated a diagram of the imperfection of the feedback DAC, representing the three states of the tri-level Delta-Sigma modulator output. It can be seen that there are two defined outputs, an output 70 associated with the {1} output and an output 72 associated with the {0} output and a straight line associated therewith, since two points will form a straight line. However, a third output 74 associated with the {−1} output is not in line with the output 70 and 72, this being the result of a non-linearity. This non-linearity will result in demodulating the high frequency out-of-band quantization noise into the base band and cause the noise to increase. In order to correct this non-linearity, the output 74 is multiplied by a factor "−α" to move the output 74 to a corrected output 76. This corrected output 76 is in line with the two outputs 70 and 72. This is described in detail in U.S. Pat. No. 5,257,026, issued on Oct. 26, 1993, which is incorporated herein by reference, noting that the correction factor "δ" is the same as α" in the present embodiment.

Figure 7:
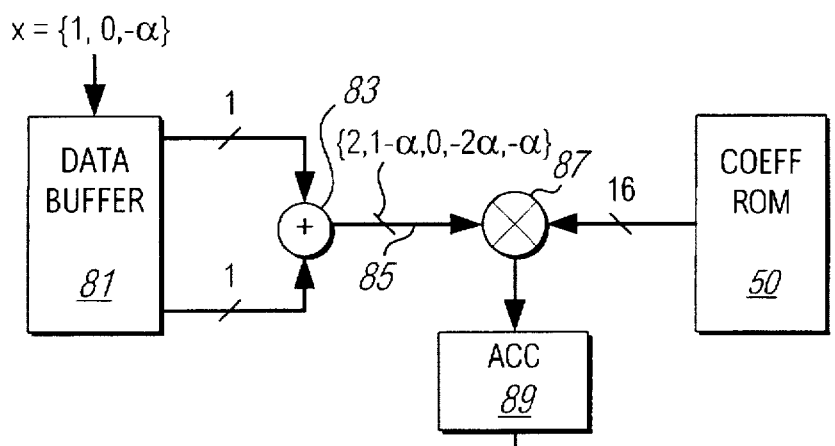
FIG. 7 illustrates a block diagram of the multi-bit input analog-to-digital converter with pre-addition.

Referring now to FIG. 7, there is illustrated an alternate embodiment of the invention for a multi-level input utilizing the pre-add configuration. A multi-level input {1,0,−α} is input to a data buffer 81, which data buffer 81 is substantially similar to the data buffer 42 in that the input values at opposite ends of the data buffer can be pulled out in accordance with the symmetry of the coefficients such that the first location and the nth location are extracted, followed by the second location and the 1-nth location, etc. The "−α" term is a result of the correction factor being directly input prior to the filtering operation. These are input to a summing junction 83, which summing junction 83 then outputs on a bus 85 the result of the summation. Since the term "−α" was included as one of the terms, the probabilities for the terms on the bus 85 are {2,1−α, 0, −2α, −α}. It can be seen that, depending upon the value of α, a relatively complex multiplier 87 will be required for multiplication with the coefficients stored in the coefficient ROM 50. This output will then be output to an accumulator 89 for output therefrom.

Figure 8:
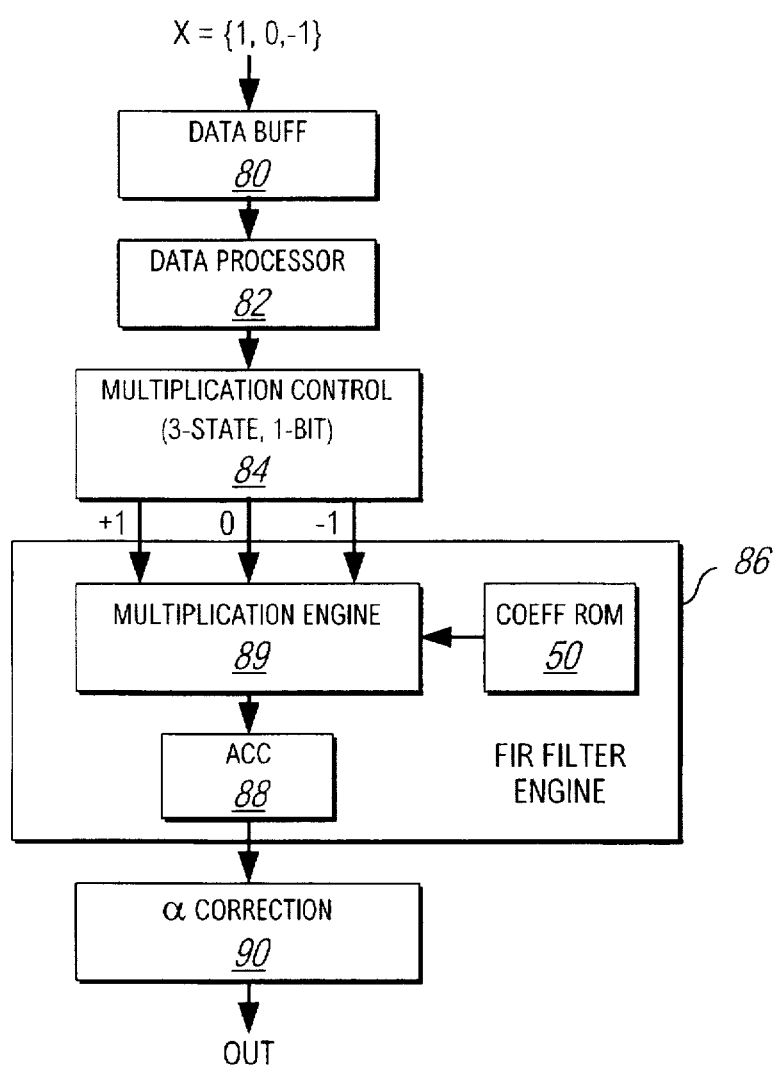
FIG. 8 illustrates a more detailed block diagram of the filter.

Referring now to FIG. 8, there is illustrated the preferred embodiment of the present invention in block diagram form. The input term {1,0,−1} is input to a data buffer 80, which terms are then processed with a data processor 82. Data processor 82 is operable to convert the input data to an acceptable state which can then be input to a multiplication control block 84 which will generate three separate controls, a pass through control (+1), a null control (0) and an invert output (−1). This is input to a FIR filter engine 86, which FIR filter engine 86 includes the coefficient ROM 50, a multiplication engine 86 and an accumulator 88. The multiplication engine 86 is operable to perform a multiplication in accordance with the operation of the data processor 82 and the multiplication control 84. As such, the data processor 82 is operable to determine the multiplication operation that is to be performed wherein the multiplication control 84 is operable to select one of three operations, pass through, null or invert with respect to the coefficients stored in the coefficient ROM 50. Therefore, the multiplication engine 86 is of relatively low complexity and the data processor 82 and multiplication control 84 are operable to provide the conversion between the tri-level data and the input to the multiplication engine 86. In the preferred embodiment, data processor 82 is comprised of the pre-add processing operation, wherein the multiplication control 84 is operable to convert the potential data values to a limit of the three operations. On the output of the FIR filter engine 86, there is provided the output correction operation in a block 90.

Figure 9:
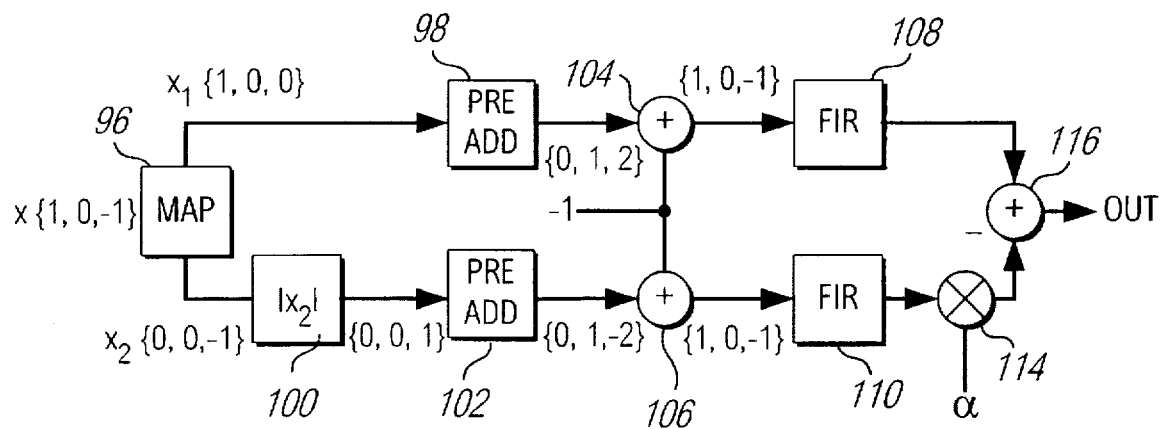
FIG. 9 illustrates a block diagram of the filter utilizing calibration of one of the inputs.

Referring now to FIG. 9, there is illustrated a block diagram of the preferred embodiment of the filter of the present invention for receiving a multi-level signal. The multi-level signal {1,0,−1} is input to a mapping block 96, which mapping block is operable to map the multi-level input into two paths, a first path labeled $x_1$ and the second path labeled $x_2$. In the path $x_1$, the "−1" value is set to "0" and in the $x_2$ path, the "+1" term is set to "0". In effect, each path now deals only with a one bit input. This is similar to the operation described in U.S. Pat. No. 5,257,026. However, in the present embodiment, a pre-add operation is utilized in both legs. In the $x_1$ leg, the input {1,0,0} is input to a pre-add block 98, the output thereof having the possibility of {0,1,2}. The $x_2$ leg has the input {0,0,−1} input to an absolute value block 100 to provide on the output thereof the set {0,0,1} which is input to a pre-add block 102 to provide the potential outputs {0,1,2}. Therefore, the output of the pre-add block 98 and the output of the pre-add block 102 have the same potential values. The output of the pre-add block 98 is then input to a summation block 104 and the output of the pre-add block 102 is input to a summation block 106. The summation blocks 104 and 106 are operable to add the respective outputs of pre-add blocks 98 and 102 with a value of "−1", a common mode offset. This basically performs an "add" operation, wherein the potential outputs from summation blocks 104 and 106 are {1,0,−1}. These are then input to FIR filter engines 108 and 110, respectively, to process the oversampled data and output a filtered digital signal at the sampling rate $f_s$. However, the "−1" term required a correction factor of α. This correction factor was provided by multiplying this "−1" term by the value of α. Since the FIR filter is a linear process, α can be multiplied either at the input or the output of the filter, such that the value "−1" need only be input prior to correction. Since the FIR filter engine 110 has 4096 taps and operates on one-half of the normal 4096 $f_s$, the multiplication is performed with a multiplication block 114 at the output of the FIR filter engine 110 at the sampling rate $f_s$ to multiply the output thereof with the value of α. Thereafter, the output of the multiplication block 114 is subtracted from the output of the FIR filter engine 108 in a subtraction block 116. This provides the output value. In effect, the subtraction operation removes the common mode value. It can therefore be seen that the FIR filter engines 108 and 110 operate on values that facilitate the use of a pass through, null, and invert multiplier operation, as was described hereinabove with reference to the multiplexor 62, with the exception that a separate block would be provided for operation of the multiplexor 62 as a function of the signals applied thereto.

Figure 10:
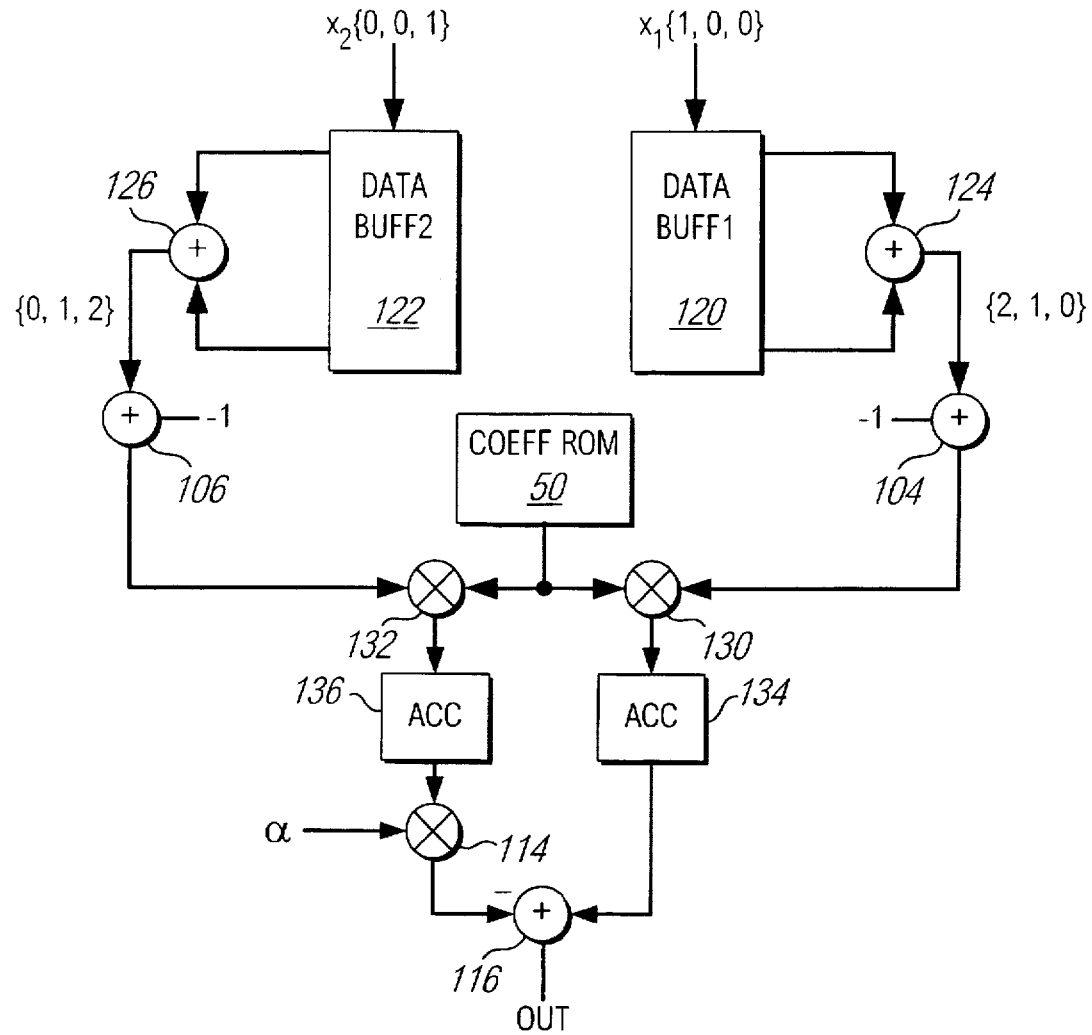
FIG. 10 illustrates a more detailed block diagram of the embodiment of FIG. 9.

Referring now to FIG. 10, there is illustrated a more detailed block diagram of the embodiment of FIG. 9. Once the values of $x_1$ and $x_2$ are determined through the mapping block 96, the values of $x_1$ are input to a data buffer 120 and the values of $x_2$, after processing through the absolute value block 100, are stored in a data buffer 122. As noted, the data $x_1$ and $x_2$ is input at the oversampled data rate. The data in data buffer 120 is then processed through a pre-add summation block 124 to provide on the output thereof the potential values {2,1,0}, which are input to the summation block 104 for summation with common mode bias "−1". Similarly, the output of the data buffer 122 is processed through a pre-add summation block 126 for output of the potential values {0,1,2} to the summation block 106 for summation with the common mode term "−1". The summation operation or the pre-add operation of the data from the data buffers 120 and 122 are performed at one-half the oversampled rate of the input date stream. The data must then be processed through the FIR filters 108 and 110, as set forth in FIG. 9, which are realized with multiplication blocks 130 and 132, respectively, and associated accumulator blocks 134 and 136, respectively.

The multiplier 130 receives on one input thereof the output from the summation block 104 and on the other input thereof the output of the coefficient ROM 50. Similarly, the multiplication block 132 receives on one input thereof the output of the summation block 106 and on the other input thereof the output of the coefficient ROM 50. The multiplication operates in parallel at one-half of the oversampled rate. The data is processed in the accumulators 134 and 136 with the output of accumulator 134 being input to the summation block 116 and the output of the accumulator 136 input to the multiplication block 114 for multiplication with the value of "α". The output of multiplication block 114, as noted above in FIG. 9, is then subtracted from the value output by the accumulator 134 to remove the common mode bias term.

Figure 11:
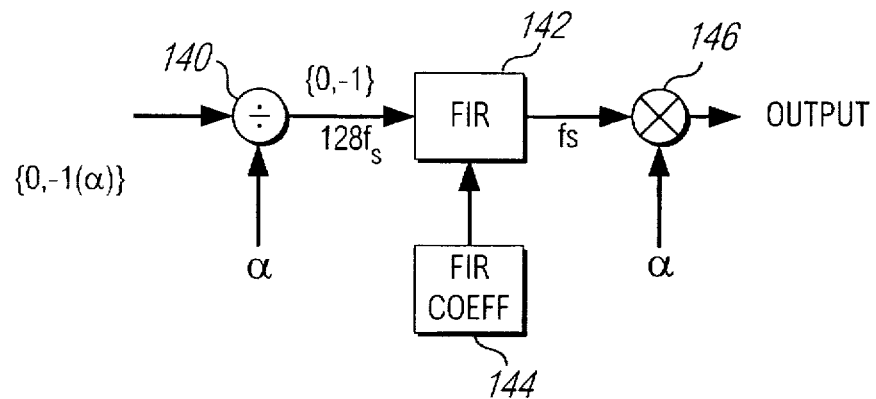
FIG. 11 illustrates a diagrammatic view of the linearity calibration operation.

Referring now to FIG. 11, there is illustrated a block diagram of the path of $x_2$, illustrating that the α-correction factor needs only be removed from the "−1" term. If the α-correction value were processed at the oversampled rate, then this would require a fairly complex multiplier in the FIR filter, but would also require this multiplication at the more complex level to be facilitated at the oversampled rate. In FIG. 11, it can be seen that the imperfect DAC causes the "−1" value to deviate from its ideal value and this must be corrected. This {0, −1/α} is at the oversampled rate, which is noted in this embodiment as being 128 $f_s$. However, any oversampled rate could be utilized. This is then input to a FIR filter 142, which FIR filter will incorporate some type of multiplication operation. However, we assume {−1/α} is "1" for now, because the use of the term "−1", requires a less complex multiplier in the FIR filter 142, since the only complex term will be the FIR coefficients in a FIR coefficient block 144. Thereafter, the output can then again be multiplied at the sampling frequency $f_s$, in a multiplication block 146 with the α-correction factor and then output. This is achievable since the FIR filter 142 is a linear system.

Figure 12:
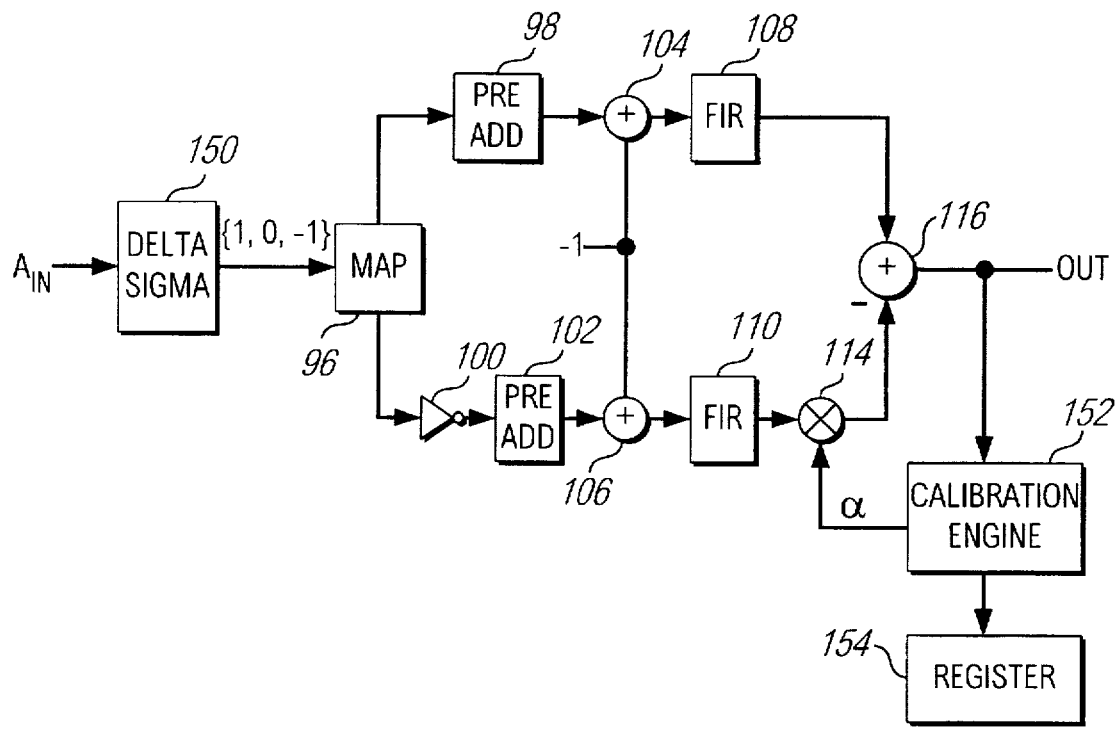
FIG. 12 illustrates a high level block diagram of the analog-to-digital converter utilizing a calibration engine and the liner phase filter.

Referring now to FIG. 12, there is illustrated a top level diagram illustrating the use of the pre-add filter in an overall analog-to-digital converter. This utilizes a Delta-Sigma converter 150 having a multi-level output for generating a multi-bit digital data stream for input to the map block 96. Additionally, a calibration engine 152 is utilized on the output to determine the value of the α-correction factor. This is stored in a register 154 after determination thereof. This was described in U.S. Pat. No. 5,257,026.

In summary, there has been provided a linear phase FIR filter utilizing a pre-addition scheme for reducing the clock rate of the multiplication relative to the number of filter taps. A relatively low complexity multiplier is utilized that is restricted to operations that multiply by a factor of "1" or "0", such that the filter coefficients can be either passed directly through, or a value of 0 passed through. Additionally, a factor of "−1" can be utilized which requires an inversion operation. The pre-addition results in a factor of "2" which must be compensated for. This is facilitated by restricting the output of the pre-addition circuit to the values of "1", "0" and "−1".

Although the preferred embodiment has been described in detail, it should be understood that various changes, substitutions and alterations can be made therein without departing from the spirit and scope of the invention as defined by the appended claims.

What is claimed is:

1. A linear phase finite impulse response (FIR) filter having a symmetrical filter coefficient set for receiving an oversampled digital data bit stream from an analog modulator and then convolving and decimating the data to a higher resolution and lower sampling rate, comprising:

a pre-addition circuit for summing the input data values associated with each of the symmetrical coefficients, such that a summed data value can be output for each set of said symmetrical coefficients wherein at least one of said summed values is a value of "2" or greater;

an encoding device for encoding the summed data into a multiplication control format restricted to the data values of "+1", "0", or "−1";

a multiplication engine for operating in conjunction with said encoded control format values and operable to pass the associated symmetrical coefficient through to an output when a "+1" value is encoded, output a null value when a "0" is encoded, and output the inverse of the associated symmetrical coefficient when a value of "−1" is encoded; and an accumulator for accumulating the output of the multiplication engine over a sampling cycle for a given set of input data values in a sampling cycle.

2. The filter of claim 1, wherein said pre-addition circuit comprises:

a buffer for buffering the oversampled digital data stream for one sampling cycle; and a summation circuit for selecting and summing pairs of said buffered data associated with a given one of the symmetrical coefficients that is input to said multiplication engine to provide on the output of said summation circuit the summing data associated with the symmetrical coefficient input to said multiplication engine.

3. The filter of claim 1, wherein said encoding device comprises an offset device for adding a multiple of the values "+1" or "−1" to said summed data to force the value to a maximum of "+1" and a minimum of "−1".

4. The filter of claim 1, wherein said multiplication engine operates at one-half the product of the number of filter coefficients and the output sampling frequency.

5. The filter of claim 1, wherein the digital data bit stream is comprised of a multi-level single-bit data stream.

6. The filter of claim 5, and further comprising a non-linearity correction device for correcting for non-linearities in the multi-level input data stream.

7. A linear phase finite impulse response (FIR) filter having a symmetrical filter coefficient set for receiving an oversampled single-bit multi-level data stream with the levels {1,0, −1}, from an analog modulator and then convolving and decimating the data to a higher resolution and lower sampling rate, comprising:

first and second processing paths, said first processing path for processing the "+1" term of the multi-level data and said second processing path for processing the "−1" term of the input data;

a mapping device for mapping a "0" to said first path when the data value is a "−1" value and mapping a "0" to said second path when the data is a "+1" value;

each of said first and second processing paths having:
   a pre-addition circuit for summing the input data values for the associated first and second processing paths, which data values are associated with each of the symmetrical coefficients, such that a summed data value can be output for each set of symmetrical coefficients for each of the first and second processing paths,
   an encoding device for encoding the summed data into a format restricted to a data value format of "+1", "0" or "−1" values wherein at least one of said summed values is a value of "2" or greater.
   a multiplication engine for operating in conjunction with said encoded format and operable to pass the associated symmetrical coefficient through said multiplication engine when a "+1" encoded value is output, a null value output from said multiplication engine when a "0" encoded format value is present and invert the coefficient value when the encoded format value is a "−1" value,
   an accumulator for accumulating the outputs of said multiplication engine over a given sampling cycle at the output sampling rate; and
   a summing circuit for summing the outputs of said accumulators for said first and second processing paths.

8. The filter of claim 7, wherein said pre-addition circuits for each of said first and second processing paths each comprise:
   a buffer for buffering the oversampled digital data bit stream for one sampling cycle; and
   a summation circuit for selecting pairs of said buffered data associated with a given one of the symmetrical coefficients that is input to said multiplication engine to provide on the output of said summation circuit the summing data associated with the symmetrical coefficient input to said multiplication engine.

9. The filter of claim 7, wherein said multiplication engines and said accumulators in said first and second processing path operate at approximately one-half the product of the number of filter coefficients and the output sampling frequency.

10. The filter of claim 7, and further comprising a correction circuit for multiplying the output of said accumulator by a correction factor, which correction factor is a predetermined correction factor that is operable to correct for non-linearities in the input multi-level data stream, which correction factor is only associated with the "−1" term.

11. The filter of claim 7, wherein said encoding device comprises:
   a first offset device for offsetting the values output by said pre-addition circuit in said first processing path by a value of "−1", such that a value of "−1" is added to the output of said pre-addition circuit in said first processing path; and
   a second offset device for offsetting the summed data output by said pre-addition circuit in said second processing path by adding a value of "+1" to said summed data value of said pre-addition circuit.

12. The filter of claim 11, wherein said second offset device is comprised of an absolute value device for taking the absolute value of the data prior to input to said pre-addition circuit in said second processing path and a summation device for summing the value of "−1" with the output of said pre-addition circuit in said second processing path.

13. The filter of claim 11, wherein said summing circuit is operable to subtract the output of said accumulator in said second processing path from the output of said accumulator in said first processing path.

14. A data converter for converting an analog signal to a digital signal and having an analog modulator for receiving an input analog signal and converting it to an oversampled digital data bit stream and a linear finite impulse response (FIR) filter, the FIR filter having a symmetrical filter coefficient set for receiving the oversampled digital data bit stream from the analog modulator and then convolving and decimating the data to a higher resolution and lower sampling rate, comprising:
   a pre-addition circuit for summing the input data values associated with each of the symmetrical coefficients, such that a summed data value can be output for each set of said symmetrical coefficients wherein at least one of said summed values is a value of "2" or greater;
   an encoding device for encoding the summed data into a multiplication control format restricted to the data values of "+1", "0", or "−1";
   a multiplication engine for operating in conjunction with said encoded control format values and operable to pass the associated symmetrical coefficient through to an output when a "+1" value is encoded, output a null value when a "0" is encoded, and output the inverse of the associated symmetrical coefficient when a value of "−1" is encoded; and
   an accumulator for accumulating the output of the multiplication engine over a sampling cycle for a given set of input data values in a sampling cycle.

15. The filter of claim 14, wherein said pre-addition circuit comprises:
   a buffer for buffering the oversampled digital data stream for one sampling cycle; and
   a summation circuit for selecting and summing pairs of said buffered data associated with a given one of the symmetrical coefficients that is input to said multiplication engine to provide on the output of said summation circuit the summing data associated with the symmetrical coefficient input to said multiplication engine.

16. The filter of claim 14, wherein said encoding device comprises an offset device for adding a multiple of the values "+1" or "−1" to said summed data to force the value to a maximum of "+1" and a minimum of "−1".

17. The filter of claim 14, wherein the digital data bit stream is comprised of a multi-level single-bit data stream.

18. The filter of claim 17, and further comprising a non-linearity correction device for correcting for non-linearities in the multi-level input data stream.

19. A data converter for converting an analog signal to a digital signal and having an analog modulator for receiving an input analog signal and converting it to an oversampled single-bit multi-level data bit stream and a linear finite impulse response (FIR) filter, the FIR filter having symmetrical filter coefficient set for receiving the oversampled single-bit multi-level data stream with the levels {1.0, −1}, from an analog modulator and then convolving and decimating the data to a higher resolution and lower sampling rate, comprising:
   first and second processing paths, said first processing path for processing the "+1" term of the multi-level data and said second processing path for processing the "−1" term of the input data;
   a mapping device for mapping a "0" to said first path when the data value is a "−1" value and mapping a "0" to said second path when the data is a "+1" value;
   each of said first and second processing paths having:
      a pre-addition circuit for summing the input data values for the associated first and second processing paths, which data values are associated with each of the symmetrical coefficients, such that a summed data value can be output for each set of symmetrical coefficients for each of the first and second processing paths, an encoding device for encoding the summed data into a format restricted to a format of "+1", "0" or "−1" values, a multiplication engine for operating in conjunction with said encoded format and operable to pass the associated symmetrical coefficient through said multiplication engine when a "+1" encoded value is output, a null value output from said multiplication engine when a "0" encoded format value is present and invert the coefficient value when the encoded format value is a "−1" value, an accumulator for accumulating the outputs of said multiplication engine over a given sampling cycle at the output sampling rate; and a summing circuit for summing the outputs of said accumulators for said first and second processing paths.

20. The filter of claim 19, wherein said pre-addition circuits for each of said first and second processing paths each comprise:

a buffer for buffering the oversampled digital data bit stream for one sampling cycle; and a summation circuit for selecting pairs of said buffered data associated with a given one of the symmetrical coefficients that is input to said multiplication engine to provide on the output of said summation circuit the summing data associated with the symmetrical coefficient input to said multiplication engine.

21. The filter of claim 19, wherein said encoding device comprises:

a first offset device for offsetting the values output by said pre-addition circuit in said first processing path by a value of "−1", such that a value of "−1" is added to the output of said pre-addition circuit in said first processing path; and a second offset device for offsetting the summed data output by said pre-addition circuit in said second processing path by adding a value of "+1" to said summed data value of said pre-addition circuit.

22. The filter of claim 21, wherein said summing circuit is operable to subtract the output of said accumulator in said second processing path from the output of said accumulator in said first processing path.

23. The filter of claim 21, wherein said second offset device is comprised of an absolute value device for taking the absolute value of the data prior to input to said pre-addition circuit in said second processing path and a summation device for summing the value of "−1" with the output of said pre-addition circuit in said second processing path.

24. A method for filtering an oversampled digital data bit stream from an analog modulator with a linear phase finite impulse response filter having a symmetrical filter coefficient set for convolving and decimating the data from the analog modulator to a higher resolution and lower sample rate, comprising the steps of:

summing the input data values associated with each of the symmetrical coefficients in a pre-addition circuit, such that a summed data value can be output for each of the symmetrical coefficients wherein at least one of said summed values is a value of "2" or greater;

encoding the summed data into a multiplication control format restricted to the data values of "+1", "0", or "−1" with an encoding device;

providing a multiplication engine;

operating the multiplication engine in conjunction with the encoded control format values in order to pass the associated symmetrical coefficient through to an output when a "+1" value is encoded, outputting null value when a "0" is encoded, and output the inverse of the associated symmetrical coefficient when the value of "−1" is encoded; and accumulating the output of the multiplication engine in an accumulator over a sampling cycle for a given set of data input values in a sampling cycle.

25. The method of claim 24, wherein the step of summing the input data values in the pre-addition circuit comprises the steps of:

buffering the oversampled digital data stream for one sampling cycle in a buffer; and selecting and summing pairs of the buffer data associated with a given one of the symmetrical coefficients that is input to the multiplication engine to provide on an output the summing data associated with the symmetrical coefficient input to the multiplication engine.

26. The method of claim 24, wherein the encoding device is operable to add a multiple of the values "+1" or "−1" to the summed data to force the value to a maximum of "+1" and a minimum of "−1".

27. The method of claim 24, wherein the multiplication engine operates at one-half the product of the number of filter coefficients and the output sampling frequency.

28. The method of claim 24, where the digital data bit stream is comprised of a multi-level single-bit data stream.

29. The method of claim 28, and further comprising correcting for nonlinearities in the multi-level input data stream.

30. A linear phase finite impulse response (FIR) filter having a symmetrical filter coefficient set for receiving a three-state multi-bit oversampled digital data bit stream from an analog modulator having values {−1, 0, +1} and then convolving and decimating the data to a high resolution and lower sampling rate, comprising:

a parsing circuit for parsing the three-state input data to first and second paths, each with two states;

a pre-addition circuit associated with each of said paths for summing the two state input data values in said associated path and associated with each of the symmetrical coefficients, such that a summed data value can be output for each set of said symmetrical coefficients for said associated path to provide three states for each of said first and second paths;

an offset device for each of said first and second paths for restricting the data values of each of said three states to "+1, " "0" and "−1";

a FIR filter engine in each of said first and second paths for filtering the three-state output of said pre-addition circuit and operating at substantially one-half clock rate of the oversampled digital data bit stream;

each of said first and second paths being non-linear; and a combiner device for combining the output of each of said FIR filter engines in said first and second paths to provide a linear output.

31. The filter of claim 30, wherein one of the three states in the input data stream causes a non-linearity and wherein said one state is restricted to one of said first and second paths and further comprising a correction circuit for correcting said non-linearity within said associated first or second paths.

32. The filter of claim 31, wherein said correction circuit is disposed after said filter.

\* \* \* \* \*